(12) United States Patent
Lin et al.

(10) Patent No.: US 12,298,825 B2
(45) Date of Patent: May 13, 2025

(54) THERMAL ENVIRONMENT EVALUATION AND COMPENSATION FOR COMPUTER COMPONENTS

(71) Applicant: Nvidia Corporation, Santa Clara, CA (US)

(72) Inventors: Qi Lin, Santa Clara, CA (US); David Haley, Santa Clara, CA (US); Chad Plummer, Santa Clara, CA (US); Hans Schulze, Santa Clara, CA (US); Darryl Moore, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1296 days.

(21) Appl. No.: 16/653,095

(22) Filed: Oct. 15, 2019

(65) Prior Publication Data

US 2020/0117254 A1    Apr. 16, 2020

Related U.S. Application Data

(60) Provisional application No. 62/745,916, filed on Oct. 15, 2018.

(51) Int. Cl.
*G06F 1/20*  (2006.01)
*G01K 7/42*  (2006.01)
(Continued)

(52) U.S. Cl.
CPC ............. *G06F 1/206* (2013.01); *G01K 7/425* (2013.01); *G01M 99/008* (2013.01);
(Continued)

(58) Field of Classification Search
CPC ... G06F 1/206; G06F 2200/201; G01K 7/425; G01M 99/008; G05B 19/404;
(Continued)

(56) References Cited

U.S. PATENT DOCUMENTS

| 5,448,143 A | 9/1995 | Pecone |
| 6,011,371 A | 1/2000 | van Brocklin et al. |

(Continued)

FOREIGN PATENT DOCUMENTS

| CN | 2612983 Y | 4/2004 |
| CN | 105138036 B | 9/2017 |

(Continued)

*Primary Examiner* — Aditya S Bhat

(57) ABSTRACT

The disclosure provides a cooling solution that evaluates the thermal environment of a computer component based on transient thermal responses of the computer component. The transient thermal responses are generated by measuring the temperature rise of the computer component over a designated amount of time for multiple "good" assemblies and multiple "bad" assemblies to determine a duration and allowable temperature rise needed to set a pass/fail criteria for different failure modes of cooling devices. A cooling device may not be operating as designed due to damage, needed maintenance, missing thermal interface material (TIM), improper installation, etc. From the transient thermal responses, a thermal problem, such as a malfunctioning fan, can be determined and a corrective action can be performed.

27 Claims, 4 Drawing Sheets

(51) Int. Cl.
*G01M 99/00* (2011.01)
*G05B 19/404* (2006.01)
*H05K 7/20* (2006.01)

(52) U.S. Cl.
CPC .. *G05B 19/404* (2013.01); *G05B 2219/49216* (2013.01); *G06F 2200/201* (2013.01); *H05K 7/20172* (2013.01); *H05K 7/20209* (2013.01); *H05K 7/20281* (2013.01); *H05K 7/2039* (2013.01)

(58) Field of Classification Search
CPC ..... G05B 2219/49216; H05K 7/20172; H05K 7/20209; H05K 7/20281; H05K 7/2039
USPC .......................................................... 702/130
See application file for complete search history.

(56) References Cited

U.S. PATENT DOCUMENTS

| | | | |
|---|---|---|---|
| 6,198,245 B1 | 3/2001 | Du et al. | |
| 6,754,607 B2 | 6/2004 | Tanabe | |
| 6,792,550 B2 | 9/2004 | Osecky et al. | |
| 6,889,908 B2 | 5/2005 | Crippen et al. | |
| 7,975,156 B2 | 7/2011 | Artman et al. | |
| 8,823,456 B2 | 9/2014 | Signoff et al. | |
| 9,341,190 B2 | 5/2016 | Berry et al. | |
| 9,562,869 B2 | 2/2017 | Mueller et al. | |
| 2004/0264124 A1* | 12/2004 | Patel | G06F 1/20 361/679.46 |
| 2006/0245136 A1 | 11/2006 | Chang et al. | |
| 2008/0088268 A1 | 4/2008 | Sakaguchi | |
| 2009/0281761 A1 | 11/2009 | Bandholz et al. | |
| 2010/0312415 A1* | 12/2010 | Loucks | H05K 7/20836 700/300 |
| 2013/0107905 A1* | 5/2013 | Campbell | G06F 1/20 374/1 |
| 2014/0145663 A1 | 5/2014 | Kitora | |
| 2014/0146846 A1 | 5/2014 | Shih et al. | |
| 2014/0159634 A1 | 6/2014 | Yokoyama | |
| 2015/0103866 A1 | 4/2015 | Samadi et al. | |
| 2016/0091234 A1 | 3/2016 | Momose et al. | |
| 2016/0239057 A1 | 8/2016 | Kocagoez | |
| 2017/0277233 A1 | 9/2017 | Yokoyama | |

FOREIGN PATENT DOCUMENTS

| | | |
|---|---|---|
| CN | 107193356 A | 9/2017 |
| DE | 29702431 U1 | 2/1998 |
| EP | 1578184 B1 | 10/2010 |
| JP | 2016072473 A | 5/2016 |

* cited by examiner

THERMAL ENVIRONMENT EVALUATION AND COMPENSATION FOR COMPUTER COMPONENTS

CROSS-REFERENCE TO RELATED APPLICATION

This application claims the benefit of U.S. Provisional Application Ser. No. 62/745,916, filed by Qi Lin, et al. on Oct. 15, 2018, entitled "AUTOMATIC THERMAL ENVIRONMENT EVALUATION AND COMPENSATION FOR INTEGRATED CIRCUITS," commonly assigned with this application and incorporated herein by reference in its entirety.

TECHNICAL FIELD

This application is directed, in general, to the thermal environment of circuits and, more specifically, to identifying causes of the high temperatures and protecting circuitry from damage due to high temperatures.

BACKGROUND

Computers include multiple components, such as processors, power supplies, data storage, etc., that generate heat. Cooling of the computers is needed to remove the heat generated by these components in order to keep the components within acceptable operating temperatures. Various cooling solutions are employed in the industry to keep the components operating without malfunctioning or failing.

SUMMARY

In one aspect, the disclosure provides a method of evaluating cooling devices in a thermal environment of a computer component. In one embodiment the method of evaluating includes: (1) measuring a baseline temperature and a baseline power of the computer component without a workload, (2) measuring a workload temperature and a workload power of the computer component a designated amount of time after applying the workload, wherein the designated amount of time is based on a cooling device and an operating condition associated with the cooling device, and (3) determining the cooling device is in a failure mode when the workload power is outside of an expected power range for the cooling device and the operating condition.

In another aspect the disclosure provides a computer component. In one embodiment, the computer component includes: (1) a memory and (2) a processor coupled to the memory, wherein the processor is configured to perform an evaluation of a thermal environment of the computer component and identify at least one modification of cooling devices associated with the thermal environment based on the evaluation.

In yet another aspect, the disclosure provides a method of compensating for an adverse thermal environment of a computer component. In one embodiment, the method includes: (1) characterizing and storing transient thermal responses of a computer component, (2) running a diagnostic test on the computer component, and (3) taking an action based on a result of the diagnostic test.

BRIEF DESCRIPTION

Reference is now made to the following descriptions taken in conjunction with the accompanying drawings, in which.

DETAILED DESCRIPTION

Figure 1:
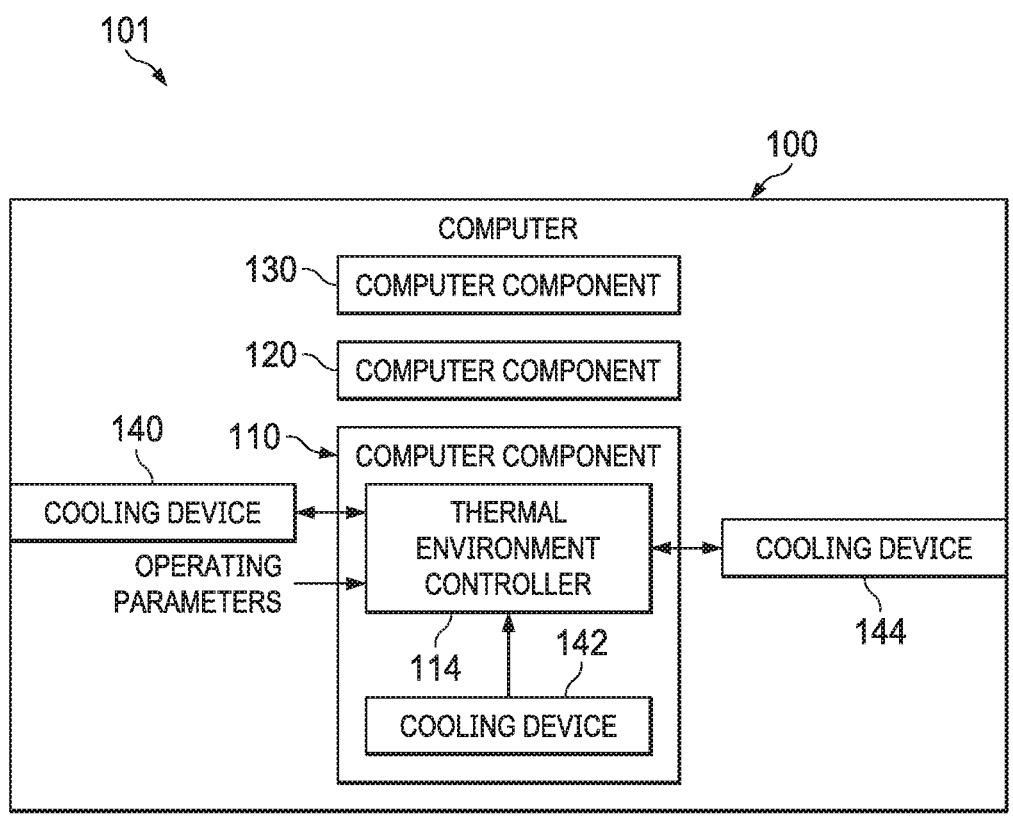
FIG. 1 illustrates a block diagram of an embodiment of a computer constructed according to the principles of the disclosure.

Improper cooling solutions can negatively affect the individual performance of a computer's components and the overall performance of the computer itself. In addition to the heat generated by the components, the cooling solutions also have to deal with variable environments including high ambient temperatures, obstructed air inlets and outlets, and dusty heatsinks. Typically, the environmental conditions of a computer can be assessed from direct measurements using sensors to measure, for example, fan speed and ambient temperature. The use of multiple sensors, however, can be expensive, complicated, and can vary depending on the type and implementations of the components.

The disclosure recognizes that being able to identify when a fan or another cooling device is not operating as designed would be beneficial; especially without employing multiple sensors that may be external to individual components. Additionally, the disclosure realizes the advantage of evaluating the environmental conditions of a computer, and then compensating for a heat source or directing the user to take an action to alleviate a heating problem. Identifying what to adjust, either automatically or manually, can also be advantageous.

Accordingly, the disclosure provides a cooling solution that evaluates the thermal environment of a computer component and identifies modifications that can be made for improved cooling. In addition to identifying modification, the influence of different cooling devices on the thermal environment can also be identified. A cooling device as used herein is a device or part that is configured, i.e., designed and constructed, to reduce heat in a thermal environment of a computer or computer component thereof. The cooling devices can be integrated with individual computer components or be part of the computer that includes the computer components. In some examples, the cooling devices can be ranked by their influence and modified accordingly; either manually or automatically.

The thermal environment can be evaluated based on transient thermal responses of the computer component. The computer component can be, for example, a processor, such as a graphics processing unit (GPU) or a central processing unit (CPU), a chip, a system-on-a-chip (SoC), an embedded computer, an automotive Electronic Control Unit (ECU), a computer card such as a graphics card, or another type of electronic or integrated circuit or device. The transient thermal responses are generated by measuring the temperature rise of the computer component over a designated amount of time for multiple "good" assemblies and multiple "bad" assemblies to determine a duration and allowable temperature rise needed to set a pass/fail criteria, referred to as a test criteria, for different failure modes of cooling devices. A failure mode occurs when a cooling device is not operating as designed. A cooling device may not be operating as designed due to damage, needed maintenance, missing thermal interface material (TIM), improper installation, etc. The designated amount of time for generating the transient thermal responses can be, for example, about 1,000 seconds. From the transient thermal responses, acceptable power ranges associated with various cooling devices can be determined. Additionally, specified limits for thermal metrics associated with the cooling devices can be determined. Temperature and power measurements of the computer component can then be made during manufacturing and after manufacturing when the computer component is implemented in the field. The temperature and power measurements of the computer component can then be compared to the determined power ranges and specified limits of the computer component to see if the computer component is within acceptable temperature and power ranges. If not, then a thermal problem, such as a malfunctioning fan, can exist.

With the thermal transient response curves, it is not only possible to determine when a thermal problem exists, but also to estimate the cooling device or associated operating condition causing a loss of cooling efficiency and to correct for deviations from the expected cooling efficiency by, for example, changing the fan speed or allowing a higher chip temperature. Thus, instead of using direct measurements from multiple sensors, the disclosure provides a cooling solution that employs thermal transient response curves to identify thermal problems and the causes of the thermal problems. Cooling devices that are in a failure mode can then be identified and actions performed in response to compensate for or to correct for the failure mode. Accordingly, computer components can be protected from high temperatures through analysis of the thermal environment without relying on multiple direct measurements.

For example, the disclosure recognizes that electrical power in becomes heat power out. Therefore, electrical power in at a steady state is equal to cooling capacity and cooling capacity is a function of the equation (die to ambient temperature delta) times (airflow) times (heatsink efficiency). With a single instantaneous measurement of the die temperature and power, the equation can be used to evaluate whether the thermal conditions are within expected bounds: as the die temperature and power is known, then (airflow, ambient temperature) is solvable as a mixed quantity. With two measurements in time at different power or die temperatures, a solution can be obtained for a system of two variables and equations to isolate both first order impacts on cooling: ambient temperature and airflow.

The disclosure provides proactive diagnosis of a thermal environment to allow adjustments before component damage. This solution can evaluate cooling degradation versus a measured reference and map the cooling degradation to a temperature domain for an ambient temperature estimate. The system and method disclosed herein can also compensate for effects of reduced airflow or ambient temperature changes. Additionally, the proactive diagnosis of the thermal environment can identify which cooling device or devices to adjust.

FIG. 1 illustrates a diagram of an embodiment of a computer 100 constructed according to the principles of the disclosure. The computer 100 includes multiple computer components and multiple cooling devices that collectively contribute to the thermal environment of the computer 100 and/or the thermal environment of each of the multiple computer components. Each of the computer components and multiple cooling devices of the computer 100 are located within or integrated with a chassis 101. The computer 100 can be, for example, a desktop computer, a laptop computer, a gaming device, a server, or another type of computing device. In FIG. 1, three computer components are specifically shown, computer component 110, computer component 120 and computer component 130. Additionally, cooling devices 140, 142, and 144, are illustrated. One skilled in the art will understand that the computer 100 can include additional devices and components that are not illustrated but are well known in the art and typically included in a computer.

The computer components 110, 120, and 130 can be communicatively coupled together via conventional conductors used in a computer, including a communications bus. As noted above, the computer components 110, 120, and 130 can be, for example, a GPU, a CPU, a SoC, etc. The computer components 110, 120, 130, can be cards that are coupled to a motherboard (not shown) of the computer 100.

The cooling devices 140, 142, and 144 can be located within the chassis 101 or integrated with the chassis 101. Additionally, the cooling devices 140, 142, and 144, can be a cooling device designated for a specific component or be a system cooling device for the computer 100. For example, cooling devices 140 and 144, can be chassis fans that are integrated with the chassis 101. Cooling device 140 can be an intake fan and cooling device 144 can be an exhaust fan. Cooling device 142 can be integrated with computer component 110. As such, cooling device 142 can be a fan, TIM, heatsink, or another type of cooling device that is designated for cooling the computer component 110.

In addition to cooling device 142, computer component 110 includes a thermal environment controller 114 that is configured to perform an evaluation of a thermal environment of the computer component 110 and identify a modification of the cooling devices 140, 142, 144, associated with the thermal environment. The thermal environment controller 114 can automatically perform the evaluation, i.e., without initiation of a user, or can perform the evaluation in response to a user's request. The request can be received by the thermal environment controller 114 via a user interface of the computer 100 (not shown). The number of modifications that are identified can be zero, one, or more based on the evaluation. The evaluation can be performed according to the methods disclosed herein. For example, the thermal environment controller 114 can perform the evaluation according to the method 300 of FIG. 3.

Figure 6:
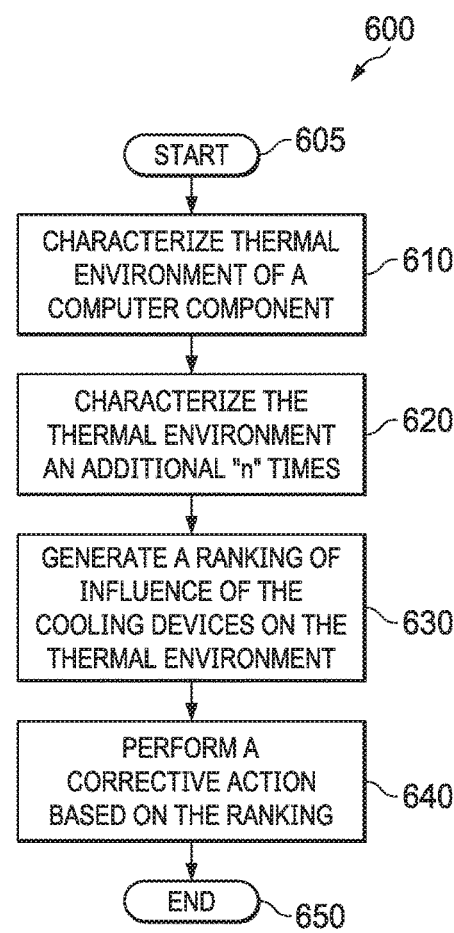
FIG. 6 illustrates a flow diagram of an embodiment of a method 600 of identifying the influence of cooling devices on a thermal environment of a computer component carried out according to the principles of the disclosure.

The thermal environment controller 114 can also characterize the thermal environment and identify the influence of the cooling devices 140, 142, 144, on the thermal environment. Using chassis fans as an example, the thermal environment controller 114 can run a workload, such as a heater workload, operate all chassis fans at max, and measure operating parameters once the operating parameters are stable. The operating parameters can include the temperature of the computer components 110, 120, 130, and other parameters that are affected by the thermal environment. Accordingly, the operating parameters can be the temperatures and clock speeds of a GPU, a CPU, and/or a HDD. Operation of the different chassis fans, such as cooling device 140 and 144, can then be isolated to determine the effect of each of the chassis fans on the thermal environment. The effect can be determined based on the influence of the operating parameters by the different chassis fans. The thermal environment controller 114 can then rank the chassis fans by their influence and provide the results to a user for manual adjustment or automatically adjust the fan or fans with the most influence. Method 600 of FIG. 6 provides an example that can be carried out by the thermal environment controller 114 for identifying the influence of cooling devices on a thermal environment.

Figure 2:
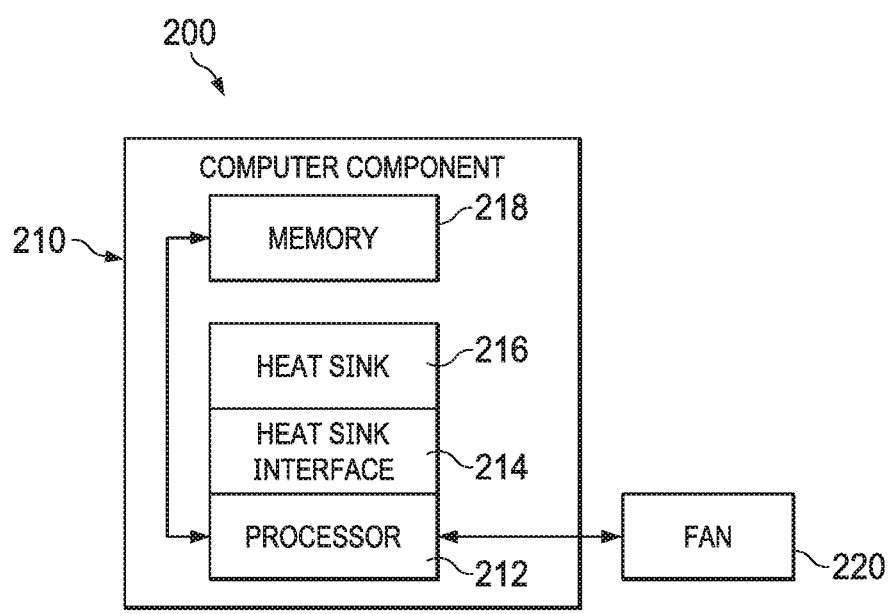
FIG. 2 illustrates a diagram of another embodiment of a computer constructed according to the principles of the disclosure.

The thermal environment controller 114 can be implemented on a processor and memory, such as the processor 212 and the memory 218 of the computer component 210 of FIG. 2. The memory can store a series of operating instructions corresponding to an algorithm or algorithms that direct the operation of the processor to perform the functions on the thermal environment controller 114. The functionality of the thermal environment controller 114 can be stored in a computer program product.

FIG. 2 illustrates a diagram of another embodiment of a computer 200 constructed according to the principles of the disclosure. The computer 200 can be, for example, a desktop computer, a laptop computer, a tablet, a smartphone, a gaming device, an embedded computer, a server, or an ECU. The computer 200 includes a computer component 210 and a fan 220. The computer 200 can include additional cooling devices or other cooling devices instead of the fan 220. The computer 200 can include additional computer components that are not illustrated but are well known in the art and typically included in computers.

The computer component 210 includes a processor 212 and a memory 218. In one example, the processor 212 can be a GPU and the computer component 210 can be a graphics card. The processor 212 is coupled to a heatsink 216 via a heatsink interface 214. The heatsink 216 could be a liquid cooled loop including a pump and radiator. The heatsink interface 214 can be, for example, a thermal interface material (TIM) and spring screws to hold the heatsink 216 on the IC. The heatsink 216, the heatsink interface 214, and the fan 220 are non-limiting examples of cooling devices that contribute to the thermal environment of the computer component 210.

The processor 212 is configured to evaluate the thermal environment of the computer component 210 and determine cooling devices that may need modification. The processor 212 can be configured to automatically evaluate the thermal environment of the computer component 210 and determine cooling devices that are in a failure mode by comparing temperature and power measurements of the processor 212 to predetermined references, or test criteria, obtained from thermal transient responses. The thermal transient responses are based on cooling devices and can be determined during diagnostic testing performed on the computer component 210. The processor 212 is further configured to automatically compensate for the failure mode by initiating an action such as changing a fan speed of the fan 220, allowing a higher operating temperature for the processor 212, or changing the allowable power or performance state of the computer component 210. Other compensating or correcting actions can be taken or instructed for a user to perform. For example, the computer component 210 can be a graphics card that was improperly installed such that the fan 220 is blocked, causing insufficient airflow. The processor 212 can provide an instruction to a user, such as via a user interface like a display or speaker, to inspect the fan 220 and remove a blockage in order to provide sufficient airflow. Accordingly, the thermal transient responses can be used to distinguish between different causes of high temperatures including a lack of airflow over the computer component 210 versus a hot ambient temperature for the computer component 210.

In this illustrated example the processor 212 is the heat source that is being monitored and is also configured to perform the diagnostic testing. In other embodiments, another processor (not shown) can be configured to perform the diagnostic testing of the processor 212. The diagnostic testing can be implemented as a software routine running on the processor 212. In various applications, the diagnostic testing could be implemented as a low-level system test, run by an operating system level program or by the kernel during boot as a self-test. In some examples, a boot routine can be used to initiate the diagnostic test or the diagnostic test could be run through a software client when initiated by a user. The memory 218 can store the software that directs the operation of the processor 212.

Figure 3:
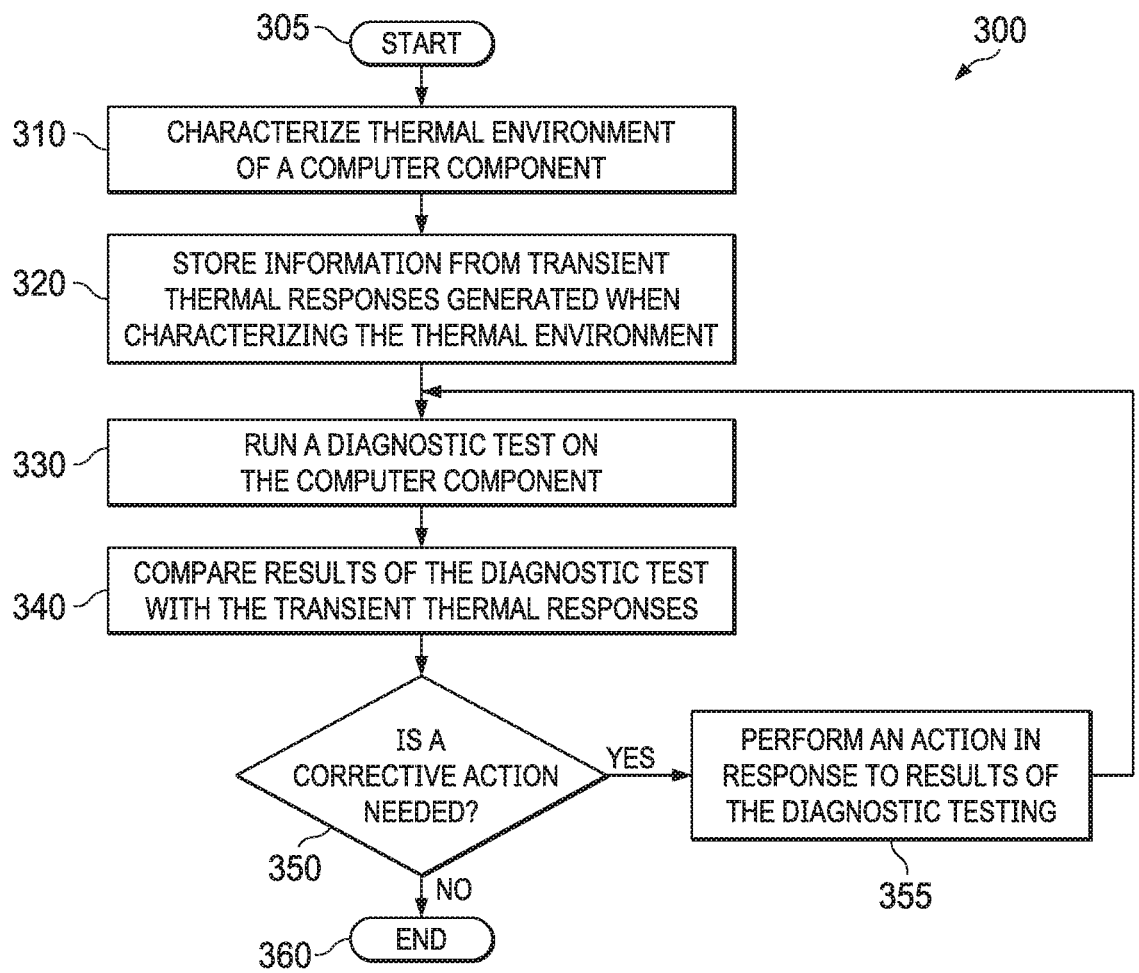
FIG. 3 illustrates a flow diagram of an embodiment of a method of compensating for an adverse thermal environment of a computer component carried out according to the principles of the disclosure.

FIG. 3 illustrates a flow diagram of an embodiment of a method 300 of compensating for an adverse thermal environment of a computer component carried out according to the principles of the disclosure. The computer component is installed in a computer or computing device. At least a portion of the method 300 can be carried out by a thermal environment controller or processor, such as the thermal environment controller 114 of FIG. 1 or the processor 212 of FIG. 2. The method 300 is agnostic to the cooling solution employed with the computer component. The method 300 begins in a step 305.

In a step 310, a thermal environment of the computer component is characterized. In one example, the thermal environment is characterized by generating transient thermal responses for the computer component based on cooling devices under different operating conditions.

The transient thermal responses can be generated by measuring the temperature rise over a designated amount of time, such as from zero to a set time, for example about 1000 seconds, for multiple "good" assemblies and multiple "bad" assemblies to determine what duration and allowable temperature rise is needed to set the test criteria for each failure mode of cooling devices. Accordingly, the transient thermal response can be developed based on various workload power stimulus under various thermal conditions.

To establish the test criteria, acceptable power ranges for various cooling devices can be determined from the transient thermal responses. Additionally, specified limits for thermal metrics associated with the cooling devices can be determined. Thus, the transient thermal responses can be used to develop various test criteria that include, for example, the acceptable ranges for power and the specified limits.

Information from the transient thermal responses is stored in a step 320. The information from the transient thermal responses can be stored in a conventional storage medium that is accessible for diagnostic testing. For example, the transient thermal response information can be stored on a memory such as the memory 218 of FIG. 2. The information includes the test criteria determined in step 310. The information can include the transient thermal responses.

In a step 330, a diagnostic test is run on the IC. The diagnostic test can be the diagnostic test represented by the method 400 in FIG. 4. The diagnostic test can be run during manufacturing (e.g., during a manufacturing process) or after manufacturing. The diagnostic test can be run as a field diagnostic test and compared to stored results of the diagnostic test run during manufacturing. For example, results of a diagnostic test performed after manufacturing can be compared to the information stored in step 320 from a diagnostic test run during manufacturing. Results of the same diagnostic test being run multiple times can be compared and used to tune the diagnostic test. In some applications multiple types of diagnostic tests can be run for evaluation of different cooling devices and failure modes.

In a step 340, results of the diagnostic test are compared with the transient thermal responses. A determination is then made in step 350 if a corrective action is needed based on the comparison of step 340. If so, the method 300 continues to step 355. If not, the method 300 continues to step 360 and ends.

In step 355, an action or actions are performed based on results of the diagnostic testing. The action can automatically compensate for a failure mode of a cooling device as determined via the diagnostic testing. The automatically compensating can include changing the fan speed settings, allowing a higher or lower operating temperature of the computer component, and changing the performance settings to a higher or lower state. The action can be informing a user of the failure mode for the user to take corrective action. Various suggestions for corrective actions can be provided to the user according to the results of the diagnostic testing.

With the transient thermal response curves, it is not only possible to determine when a thermal problem exists, but also to estimate the environment conditions (or cooling device) causing a loss of efficiency and to correct for deviations from the expected cooling efficiency by, for example, changing the fan speed or allowing a higher chip temperature. The step 355 can be performed automatically by a processor. The method 300 can continue to step 330 after step 355 until it is determined that no corrective action is needed. In some examples, the method 300 can continue to step 340 after step 355.

Figure 4:
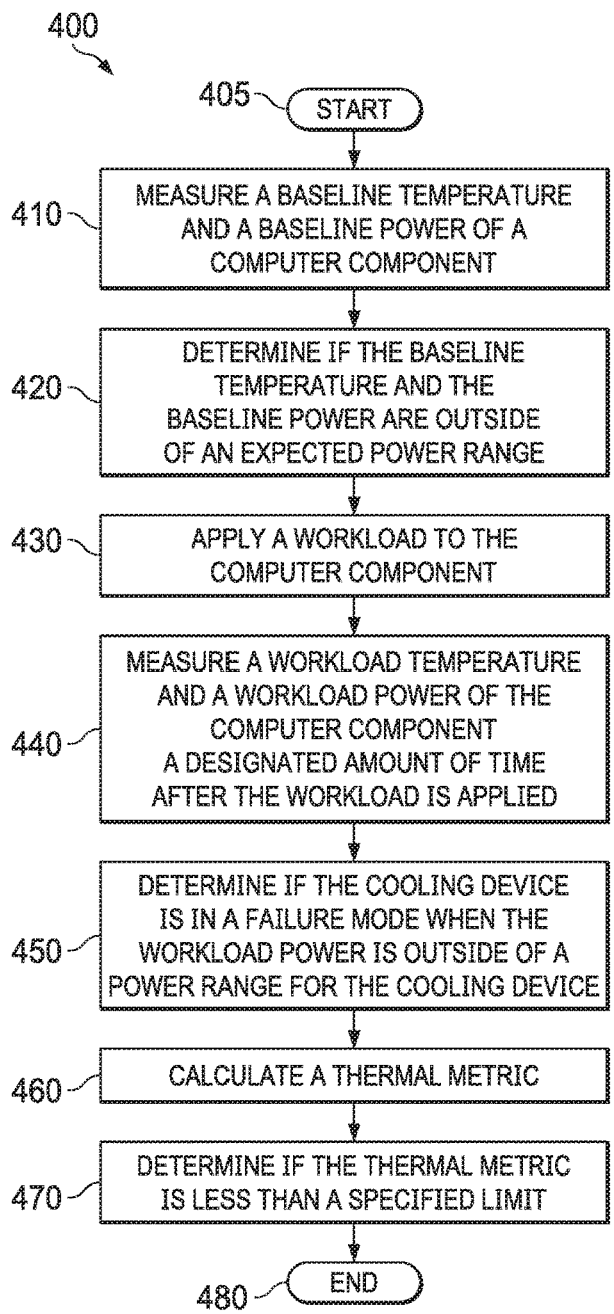
FIG. 4 illustrates a flow diagram of an embodiment of a method of performing a diagnostic test for a computer component carried out according to the principles of the disclosure.

FIG. 4 illustrates a flow diagram of an embodiment of a method 400 of performing a diagnostic test for a computer component carried out according to the principles of the disclosure. The method 400 can be run during manufacturing or after manufacturing of the computer component. The method 400 can be run as a field diagnostic test and compared to stored results of the diagnostic test run during manufacturing.

The diagnostic test can be controlled by an algorithm represented by a series of operating instructions stored on a non-transitory computer readable medium. The diagnostic test and results from the diagnostic test can be stored on or with the computer component or product on which the test was performed. The results and test can be stored in, for example, a driver, firmware, or a memory such as ROM, of a component or product and used after manufacturing for comparison to provide proactive diagnostics. The results and test, for example, can be stored in a memory such as the memory 218 of FIG. 2. The method 400 begins in a step 405.

In a step 410, a baseline temperature and a baseline power of a computer component are measured. The baseline temperature and power are measured while there is no workload running on the computer component. This allows characterization of a starting point. Temperature and or power measurement sensors on the computer component or on a printed circuit board (PCB) near the computer component can be used to measure the baseline temperature and the baseline power. The power sensors can measure power by: 1) measuring the voltage, 2) by measuring the voltage drop across a sense resistor and multiplying this by one divided by the resistance of the sense resistor to obtain a current measurement, and 3) multiplying the measured voltage by the measured current. The temperature sensors can be inside the die, or an external circuit that reads a thermal diode on the die. The power measurement circuit and sense resistors can be located on the PCB.

In a step 420, a determination is made if the baseline temperature and the baseline power are outside of an expected power range. The expected power range is determined from thermal transient responses generated for various cooling devices under different operating conditions. For example, the cooling device can be a fan and the operating conditions can be a percentage of the operating power of the fan. The operating conditions can also include, for example, a blocked intake or blocked exhaust of the fan. If outside of the expected power range, the diagnostic test fails.

In a step 430, a workload is applied to the computer component. The computer component can be a GPU and the workload can have a high and steady power profile. The applied workload is a known workload that is intended to heat up the computer component.

In a step 440, a workload temperature and a workload power of the computer component (thus a computer component workload temperature and a computer component workload power) are measured a designated amount of time after the workload is applied. The same sensors can be used that were used for measuring the baseline temperature and baseline power. The designated amount of time is based on a cooling device. For example, the designated amount of time is for N seconds where N is about one to two seconds for a thermal interface material and about 100-200 s for a fan related issue as denoted in FIG. 5A and FIG. 5B. The number of failure modes and the designated amount of time (time-to-fail) will vary from product to product.

In a step 450, a determination is made if the cooling device is in a failure mode when the workload power is outside of the expected power range for the cooling device. Step 450 is used to ensure the workload, for example a heater workload, is functioning properly. It provides a check that the measurements of step 440 are valid. If the workload does not start, then determining if a cooling device is actually in a failure mode is not performed since the system will not be heated and there will be no meaningful thermal response to evaluate.

In a step 460, a thermal metric is calculated. The thermal metric is $\Delta T/\Delta P$ where $\Delta T$ is the workload temperate minus the baseline temperature, and $\Delta P$ is the workload power minus the baseline power. As such, the thermal metric represents the temperature rise over the power change for the designated amount of time. If the power measurement is not available, then $\Delta T$ alone may be used as the thermal metric.

In a step 470, a determination is made if the thermal metric is less than a specified limit. If so, the thermal condition is not a failure mode. As noted above regarding step 440, the number of failure modes and the designated amount of time (time-to-fail) will vary from product to product. A failure mode can be determined at multiple points in time due to the timescale associated with different cooling devices. This calculation can be done at discrete $\Delta t$ intervals or continuously along the curve (which is effectively doing the $\Delta T/\Delta P$ calculation at a sampling rate). The sampling rate can vary depending on the various applications in which the computer component is implemented. The method 400 ends in a step 480.

Figure 5A:
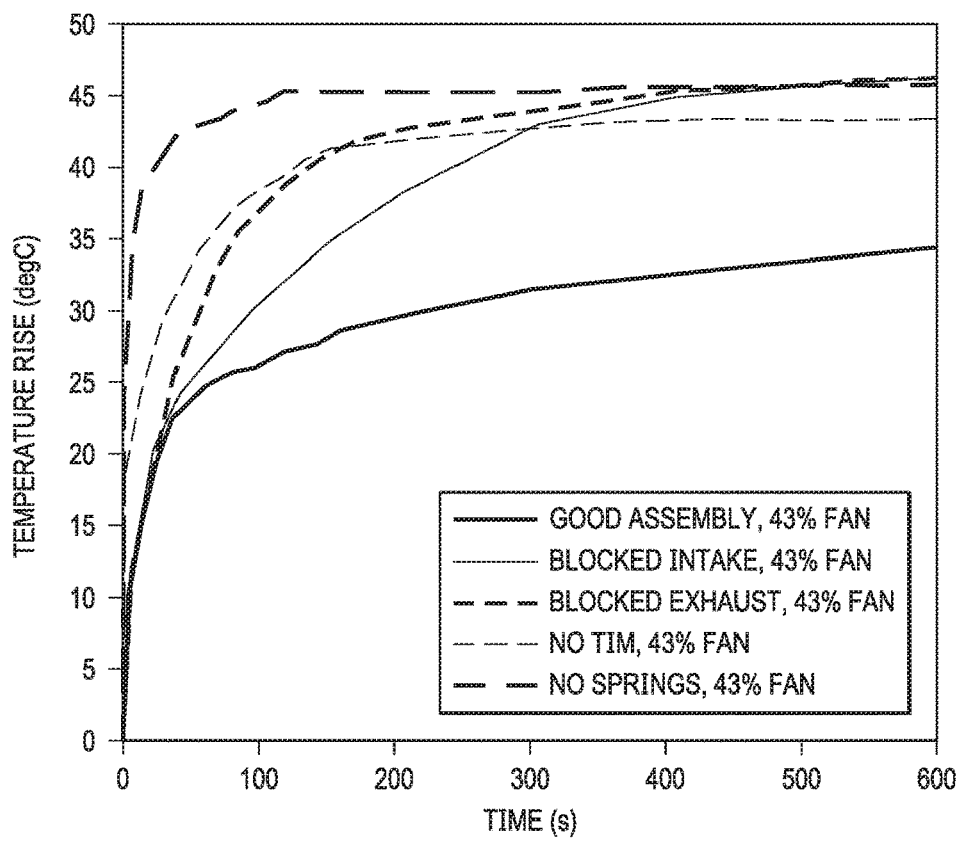
FIG. 5A and FIG. 5B illustrate diagrams of thermal transient responses for various cooling devices and operating conditions.
Figure 5B:
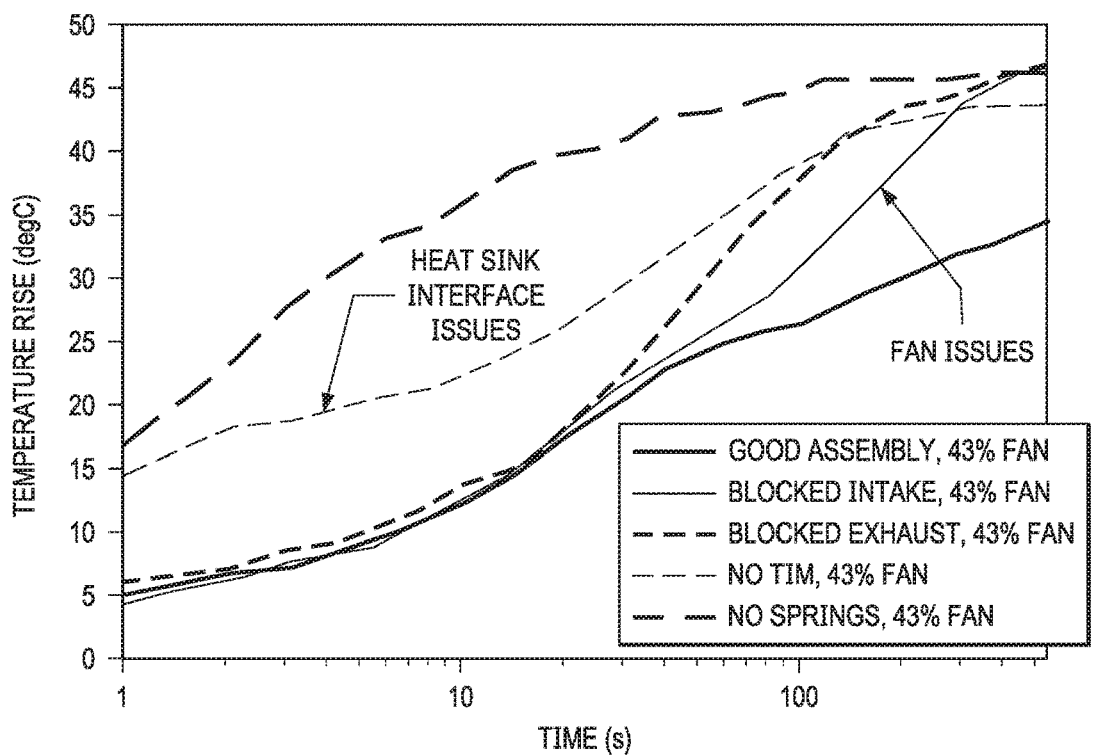

FIG. 5A and FIG. 5B illustrate diagrams of thermal transient responses for various cooling devices and operating conditions. FIG. 5A and FIG. 5B illustrate a benefit of being able to detect heating problems early on during operation before a steady state occurs and heat damage can result, i.e., proactive diagnostics to prevent failure. The thermal transient responses can be normalized in power as $\Delta T/\Delta P$ to remove the effect of power variation. FIG. 5A and FIG. 5B are shown in terms of temperature rise $\Delta T$ for clarity. Two different examples of cooling device issues, heatsink interface issues and fan issues, are illustrated in FIGS. 5A and 5B. Other failure modes can be represented and stored for comparison. For different components or products, the type and amount of information stored and examined can vary. FIG. 5A and FIG. 5B represent the same information with FIG. 5A in a linear time scale of seconds and FIG. 5B in a log time scale of seconds. The y axis for FIGS. 5A and 5B is in degrees Celsius.

In FIGS. 5A and 5B failure modes for heatsink interface issues and fan issues are generated and can be used for future comparisons to determine if and what type of failure mode exists. In FIGS. 5A and 5B the fan is operated at the same speed of 43%. The solid line indicates a transient thermal response for a properly operating assembly. The other transient thermal responses represent failure modes for heatsink interface issues, including no TIM and no springs, and fan issues, including a blocked intake and a blocked exhaust. FIGS. 5A and 5B illustrate the propagation of heat over time associated with a computer component, such as the processor 212 in FIG. 2. As such, the transient thermal responses indicate that heatsink interface issues can be captured around two seconds and fan issues can be captured by 200 seconds. As such, a duration of two seconds can be used for determining heatsink interface issues and a duration of 200 seconds can be used for determining fan issues. FIGS. 5A and 5B provide examples that various failure modes become apparent at different times and various check points or durations are needed to check for the different failure modes.

FIG. 6 illustrates a flow diagram of an embodiment of a method 600 of identifying the influence of cooling devices on a thermal environment of a computer component carried out according to the principles of the disclosure. The determined influence can be used as a basis for choosing a corrective action. The type of cooling devices to identify can vary depending on, for example, the computer component and the cooling devices that contribute to the thermal environment. For method 600, there are "n" cooling devices affecting the thermal environment. Chassis fans are used as an example of cooling devices for the below discussion. The chassis fans are cooling devices of a computer in which the computer component is installed. For example, the cooling devices 140, 144, in FIG. 1. The method 600 begins in a step 605.

In a step 610, a thermal environment of the computer component is characterized. The thermal environment can be characterized according to step 310 of the method 300. Considering chassis fans, a workload is applied to the computer component and all of the chassis fans of the computer are operated at maximum speed. The workload can be a known workload that is intended to heat up the computer component. Operating parameters (a workload temperature and a workload power of the computer component (thus a computer component workload temperature and a computer component workload power) are measured a designated amount of time after the workload is applied. The designated time corresponds to the when the operating parameters are stable.

The thermal environment is characterized an additional n times in a step 620. For each of thermal environment characterizations of step 620, a different one of the cooling devices are modified. For example, for each of the thermal environment characterizations of step 620, a different one of the chassis fans are set to a minimum operating speed while the remaining system fans are operated at a maximum operating speed. Using FIG. 1 as example with cooling device 140 being an intake fan and cooling device 144 being an exhaust fan, n is two. For the first characterization of step 620, intake fan 140 can be set to a minimum speed and exhaust fan 144 set to a maximum speed. For the second characterization of step 620, intake fan 140 is set to a maximum speed and exhaust fan 144 is set to a minimum speed.

In a step 630, the cooling devices are ranked by their influence on the thermal environment. The influence of each of the cooling devices can be determined by the effect on the thermal environment. The effect can be based on the thermal environment characterizations obtained in steps 610 and 620. For example, the influence of the different chassis fans can be determined based on the thermal environment characterizations obtained in step 610 and in step 620 when each of the chassis fans are operated at either a maximum or minimum operating speed. The effect of each of the chassis fans can be compared and placed in order to provide a ranking of influence.

Corrective actions are made to the cooling devices based on the rankings in a step 640. In some examples, a corrective action may not be needed. When one is needed, a corrective action or actions can be performed based on the rankings to provide the most benefit. The adjustments can be made automatically, by a processor configured to perform the functions of a thermal environment controller. In other examples, the rankings can be provided to a user for manual adjustments. Considering the chassis fans, the speeds of a fan or fans can be adjusted. The adjustments to the fan speeds can be based on multiple linear regression of influence on the thermal environment. In some applications, a slider can be provided to a display to allow a user to adjust the fan speeds according to the rankings. The method 600 then continues to step 650 and ends.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A method of evaluating cooling devices in a thermal environment of a computer component, comprising:
measuring, using sensors, a baseline temperature and a baseline power of the computer component without a workload;
measuring, using the sensors, a workload temperature and a workload power of the computer component a designated amount of time after applying the workload, wherein the designated amount of time is determined from transient thermal responses and is based on a cooling device in the thermal environment and an operating condition associated with the cooling device, wherein the transient thermal responses represent failure modes of cooling devices associated with the thermal environment and the designated amount of time is a time-to-fail indicated in the transient thermal responses for the cooling device;
determining the cooling device is in a failure mode when the workload power is outside of an expected power range for the cooling device and the operating condition, and
compensating for the failure mode by automatically performing one or more corrective actions that include adjusting an operating temperature of the computer component.

2. The method as recited in claim 1 further comprising determining the cooling device is not in a failure mode when a thermal metric is less than a specified limit, wherein the thermal metric is based on a difference between the workload temperate and the baseline temperature, and a difference between the baseline power and the workload power.

3. The method as recited in claim 2 wherein the thermal metric is either $\Delta T$ or $\Delta T/\Delta P$ where $\Delta T$ is the workload temperature minus the baseline temperature, and $\Delta P$ is the workload power minus the baseline power.

4. The method as recited in claim 2 further comprising determining the specified limit from the transient thermal responses.

5. The method as recited in claim 2 wherein each of the measuring and determining steps is automatically performed.

6. The method as recited in claim 5 wherein each of the steps is part of a diagnostic test for the computer component.

7. The method as recited in claim 6 wherein the diagnostic test is run during a manufacturing process of a product including the computer component.

8. The method as recited in claim 7 wherein the diagnostic test is run during a field diagnostic of the computer component, the method further comprising comparing results of the diagnostic test during the field diagnostic to results of the diagnostic test during the manufacturing process.

9. The method as recited in claim 1 wherein the cooling device is a device that contributes to the thermal environment.

10. The method as recited in claim 9 wherein the cooling device is selected from the group consisting of:
a thermal interface material,
springs for a heatsink,
a heatsink,
components of a liquid cooling loop, and
a fan.

11. The method as recited in claim 1 wherein the transient thermal responses are generated before measuring the baseline temperature and the workload temperature.

12. The method as recited in claim 1, wherein the one or more corrective actions further include automatically adjusting a fan speed.

13. The method as recited in claim 1, wherein the computer component is a system containing one or more SoCs or graphics processing units (GPUs).

14. The method as recited in claim 1, wherein the computer component is a system-on-a-chip (SoC).

15. The method as recited in claim 1 further comprising measuring workload temperatures and workload powers of the computer component at various designated amount of times after applying the workload, wherein the various designated amount of times are each based on one of multiple cooling devices and transient thermal responses.

16. The method as recited in claim 1 wherein the computer component is a graphics processing unit (GPU).

17. The method as recited in claim 1 wherein the computer component is a graphics card.

18. A computer component of a computing device, comprising:
a processor to perform operations that include performing an evaluation of a thermal environment of the computer component as designated amounts of time using transient thermal responses of the computer component that represent failure modes of cooling devices associated with the thermal environment, wherein the designated amounts of time indicate different times-to-fail of the cooling devices, and performing, based on the evaluation, one or more corrective actions for at least one of the cooling devices, wherein the cooling devices include one or more fans and the one or more corrective actions include automatically adjusting a fan speed.

19. The computer component as recited in claim 18, wherein the evaluation is automatically performed and identifies cooling devices that are in a failure mode by comparing temperature and power measurements of the processor to predetermined references obtained from thermal transient responses.

20. The computer component as recited in claim 19 wherein the predetermined references are power ranges and specified limits for a thermal metric calculated from the temperature and power measurements.

21. The computer component as recited in claim 19 wherein the one or more corrective actions further include automatically adjusting an operating temperature for the processor.

22. The computer component as recited in claim 18, wherein multiple of the cooling devices are fans and the operations further include providing a ranking of the fans according to their influence on the thermal environment.

23. The computer component as recited in claim 22, wherein the automatically adjusting the fan speed is performed according to the ranking.

24. A method of compensating for an adverse thermal environment of a computer component, comprising:
characterizing and storing transient thermal responses of a computer component, wherein the transient thermal responses represent failure modes of cooling devices associated with the thermal environment;
running a diagnostic test on the computer component using at least one designated amount of time that is a time-to-fail indicated in the transient thermal responses for one of the cooling devices;

determining when a corrective action is needed based on comparing results of the transient thermal responses and the diagnostic test; and performing, when needed, the corrective action based on a result of the diagnostic test, wherein the corrective action includes adjusting a fan speed or adjusting an operating temperature of the computer component.

25. The method as recited in claim 24, wherein the performing is needed when the diagnostic test identifies a failure mode.

26. The method as recited in claim 24, further including informing a user of a failure mode.

27. The method as recited in claim 24 wherein the performing the corrective action is based on a ranking of cooling devices according to their influence on the thermal environment.

* * * * *